United States Patent [19]

Niggemann

[11] Patent Number: 4,790,370
[45] Date of Patent: Dec. 13, 1988

[54] HEAT EXCHANGER APPARATUS FOR ELECTRICAL COMPONENTS

[75] Inventor: Richard E. Niggemann, Rockford, Ill.

[73] Assignee: Sundstrand Corporation, Rockford, Ill.

[21] Appl. No.: 193,144

[22] Filed: May 6, 1988

Related U.S. Application Data

[63] Continuation of Ser. No. 87,126, Aug. 19, 1987, abandoned.

[51] Int. Cl.⁴ ............................................. H01L 23/44
[52] U.S. Cl. .................... 165/104.33; 165/41; 165/104.27; 165/917; 361/385
[58] Field of Search ............. 165/104.33, 41, 104.21, 165/104.19, 104.27, 104.32, 917; 361/385

[56] References Cited

U.S. PATENT DOCUMENTS

| | | | |
|---|---|---|---|
| 2,777,009 | 1/1957 | Whitman | 165/104.21 |
| 2,893,706 | 7/1959 | Smith | 165/104.19 |
| 3,024,298 | 3/1962 | Goltsos et al. | |
| 3,091,722 | 5/1963 | Borowiec et al. | 361/385 |
| 3,242,250 | 3/1966 | Brezezinski | 165/104.32 |
| 3,489,207 | 1/1970 | Miller | 165/104.33 |
| 3,623,546 | 11/1971 | Sharp et al. | |
| 4,057,104 | 11/1977 | Altoz | 165/104.21 |
| 4,331,830 | 5/1982 | Conway et al. | |

Primary Examiner—Albert W. Davis, Jr.
Attorney, Agent, or Firm—Wood, Dalton, Phillips, Mason & Rowe

[57] ABSTRACT

A heat exchanger apparatus for electrical components submerged in a dielectric liquid includes a closed main chamber for holding the liquid and a non-condensible gas above the liquid. A closed blockage chamber is positioned within the main chamber in contact with the dielectric. The blockage chamber holds non-condensible gas and segregates the gas and vapors of the liquid formed during operation of the heat exchanger. The side walls of the chambers are spaced from each other to form a narrow condensation and segregating duct within which the vapors of the liquid rise and condense. An orifice is provided in the closed blockage chamber near the top thereof. The orifice is sized to allow entry into the blockage chamber of the non-condensible gas as the gas is swept up the duct but to inhibit entry of the liquid should the apparatus be inverted or experience zero gravity forces.

14 Claims, 2 Drawing Sheets

WARM AIR OUT

HEAT EXCHANGER APPARATUS FOR ELECTRICAL COMPONENTS

This application is a continuation, of application Ser. No. 087,126, filed Aug. 19, 1987 now-abandoned.

FIELD OF THE INVENTION

This invention generally relates to heat dissipating means for electrical components and, particularly, to a heat exchanger apparatus for the electrical components which can withstand zero gravity forces or inversion such as in aircraft or aerospace applications.

BACKGROUND OF THE INVENTION

It is common for components which generate a moderate amount of heat to be cooled for heat dissipation purposes. For instance, electrical components which generate a moderate amount of heat may be mounted in a metallic container that is surrounded by a gaseous dielectric. The generated heat is transferred to the surrounding air and conducted by the metallic container.

However, components that generate a considerably greater amount of heat require a liquid dielectric for conducting the heat from the components, such as through a metallic housing. When a liquid dielectric coolant is required, allowance must be made for thermal expansion of the liquid in the container. If a container is only partially filled to provide space for the dielectric liquid coolant to expand, voids in the coolant may create hot spots or electrical breakdown. This problem has been addressed by various approaches, such as that shown in U.S. Pat. No. 2,777,009 to Whitman, dated Jan. 8, 1957.

In Whitman, electrical apparatus are submerged in a dielectric liquid within a closed main tank, with a non-condensible gas above the liquid. A gas tank is disposed within the main tank for segregating the gas and vapors of the liquid formed during operation of the apparatus. The gas tank has an open top and the bottom of the gas tank contacts the liquid. The side walls of the two tanks are narrowly spaced within which vapors of the liquid continuously rise during operation and condense while simultaneously sweeping the non-condensible gas up the space into the gas tank.

Known approaches such as that shown and generally described above in relation to the Whitman patent are operationally functionable as long as there are adequate gravitational forces to hold the liquid at the bottom of the main tank and as long as the tanks remain upright. However, such approaches are not applicable should the tanks become inverted or experience zero gravitational forces such as in aerospace applications. At "0° G", the dielectric liquid might literally lift off the electrical components which could burn out in seconds. Such an occurrence might be experienced when an aircraft has a sudden fall through space, for instance. There is a definite need for a heat exchanger apparatus for electrical components used in such applications.

The present invention is directed to solving the aforementioned problems and satisfying the need for a heat exchanger apparatus of the character described.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
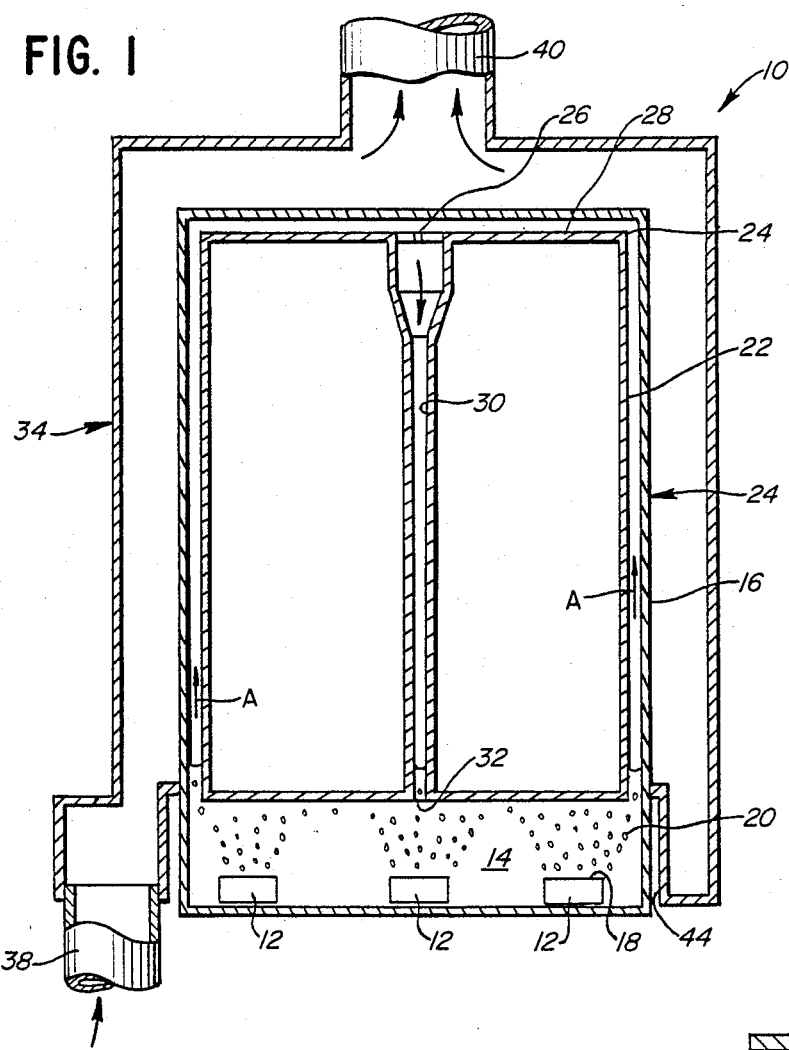
FIG. 1 is a somewhat schematic, vertical section through a heat exchanger apparatus embodying the concepts of the invention.

Referring to the drawings in greater detail, and first to FIG. 1, the invention is shown herein in the form of a heat exchanger apparatus, generally designated 10, for dissipating heat from electrical components 12 submerged in a dielectric liquid 14 at the bottom of a closed main chamber or tank 16. The tank 16 is hermetically sealed and fabricated of heat dissipating material such as metal. The apparatus is designed to accommodate such types of electrical components as silicone chips which may be on the order of ¾"–1" diameter. The components are high output and may be on the order of 30–50 watts per square centimeter. A number of the silicone chips or devices may be fabricated in a module. In other words, the electrical components with which the invention are applicable are components which have a very high amount of heat to be dissipated.

The apparatus is shown in FIG. 1 in an upright condition. However, the invention is directed to conditions which might be encountered in aerospace applications wherein the apparatus may become tilted or inverted or experience zero gravitational forces. Under such conditions, should dielectric liquid 14 come off of electrical components 12, such as the aforementioned silicone devices, the devices actually could burn out in a matter of seconds. The apparatus of this invention is designed to withstand as much as fifteen seconds of an inverted condition or zero gravitational forces, such as during a fall through space of an aircraft.

The dielectric fluid 14 is shown in FIG. 1 as boiling, as at 18, to form vapor bubbles 20 which turn into vapor and rise in the direction of arrows "A". The dielectric liquid may be a form of Freon, such as that made by 3M Company under the trade name Fluorinert. It is contemplated that the dielectric liquid may have a boiling point of 100° C., with a vapor pressure of 0.6 psi at room temperature.

The invention contemplates providing means in the form of a closed blockage chamber 22 within closed main chamber 16 for holding a non-condensible gas, such as Nitrogen and segregating the gas and vapors of the dielectric liquid formed during operation of the heat exchanger. As can be seen in FIG. 1, blockage chamber 22 is positioned within main chamber 16 on top of and in contact with dielectric liquid 14. The side walls of the two chambers may be cylindrical, for instance, and are spaced from each other to form narrow condensation and segregating duct means 24 thereabout within which the vapors of dielectric liquid rise and condense. In normal operation, the upper areas of the duct means is filled with non-condensible gas.

A small orifice 26 is formed near and effectively through an upper wall 28 of closed blockage chamber 22. This orifice is sized to allow entry into the blockage chamber of the non-condensible gas as the gas is swept up duct means 24, but to inhibit entry of any dielectric liquid should the apparatus be inverted or experience zero gravity forces. The orifice may be on the order of 0.010 inch to inhibit entry of the liquid. This would enable the apparatus to withstand an inverted condition on the order of fifteen seconds.

Another problem encountered in boiling fluids is the low vapor pressure or vapor density which is extremely low. Therefore, the invention contemplates precharging the apparatus, i.e. closed blocking chamber 22, to a given pressure level to prevent extremely fast or volatile boiling, commonly called "geysering". This, in and of itself, could create a condition of electrical component burnout. The amount or degree of precharging the apparatus would depend upon the dielectric liquid being used. Simply put, the system would be precharged to create a condition where the boiling point of the liquid must reach the precharge pressure. Of course, with orifice 26, by precharging blockage chamber 22, the duct means 24 about the upper areas of the blockage chamber, above the concentrated vapor, also would be precharged.

Means are provided for returning any liquid which might condense on or around upper wall 28 of blockage chamber 22 back to the liquid below the blockage chamber at the bottom of main chamber 16. Specifically, a funnel-shaped channel 30 is formed through the blockage chamber and leads to a small liquid passage opening 32 at the bottom of the channel in communication with the reservoir of liquid at the bottom of the main chamber.

Air impingement means, generally designated 34, also are provided about closed main chamber 16 for directing cooling air against the chamber. The air impingement means 34 is provided with a cool air inlet 38 and a warm air outlet 40.

Figure 2:
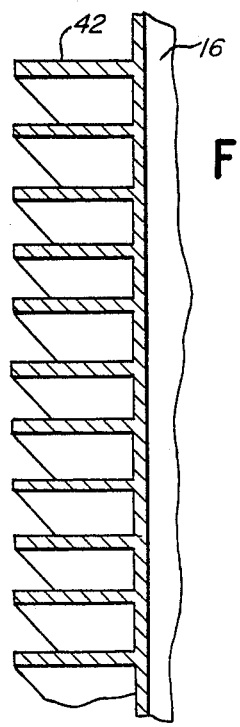
FIG. 2 is an illustration of the finned exterior surface of the main chamber of the apparatus.

FIG. 2 shows that the exterior of main chamber 16 also may be provided with cooling fins 42 to facilitate the dissipation of heat. The fins may be spaced on the order of 3-6 inches for cleaning purposes.

Lastly, as stated in the description of the drawings, the invention is shown somewhat schematically herein. It will be understood that hermetically sealed, metal closed main chamber 16 must be supported by some form or another of subjacent support means (not shown), and air impingement means 34 obviously is appropriately supported about main chamber 16. However, it should be noted that air impingement means 34 has an open end 44 through which main chamber 16 is positionable. This enables the main chamber to be readily removed for cleaning purposes. This is particularly important in aircraft applications where cabin air often is used as the cooling air in heat exchanger devices. The cabin air often is laden with cigarette smoke, or the like, which can cause residue buildup, resulting in the need for ready cleaning of the heat exchanger surfaces of the apparatus.

Figure 3:
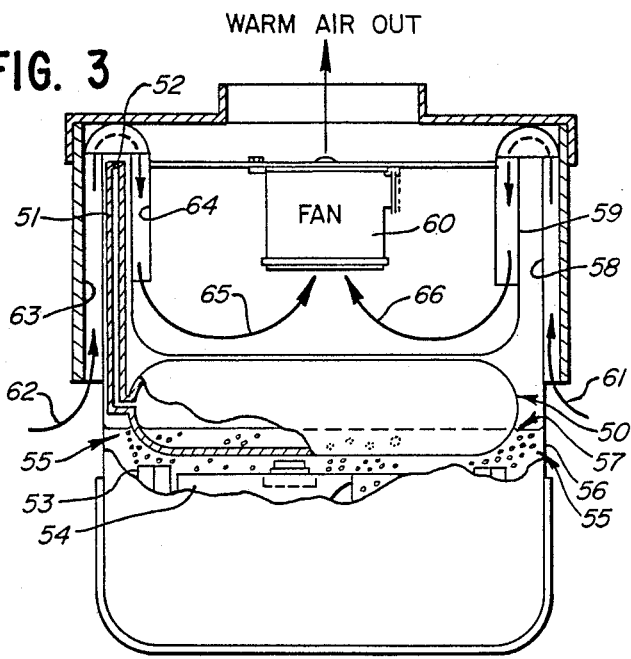
FIG. 3 is another embodiment of the invention.

FIG. 3 is directed to a cross-section illustration of another embodiment of the invention. The embodiment of the invention in FIG. 3 is characterized by the utilization of a blockage chamber 50 which includes a tube 51 connected as shown at the left hand end thereof. At the upper end of the tube 51 is a small orifice 52 which functions in the same manner as orifice 26 shown in FIG. 1.

The heat exchanger of FIG. 3 includes electrical components 53, 54 submerged in a dielectric liquid 55. A closed main chamber 56 is provided for holding the dielectric liquid 55 and a non-condensible gas above the surface 57 of the liquid 55.

The blockage chamber 50 provides an enclosed space for non-condensible gas and acts to segregate the gas an vapors of the liquid formed during operation of the heat exchanger. As can be readily noted in FIG. 3, the blockage chamber 50 is positioned within the main chamber 56 in contact with the dielectric liquid 55. Sidewalls 58, 59 which are shown spaced apart form narrow condensation and segregating duct means within which the vapors of the liquid rise and condense. The orifice 52 in tube 51 is located near the top of the heat exchanger main chamber 56. The orifice 52 is sized to allow entry into the blockage chamber 50 of the non-condensible gas as the gas is swept up the duct means and to inhibit entry of liquid should the apparatus be inverted or experience zero gravity forces.

This embodiment of the invention is provided with a fan 60 as shown which draws cool air as indicated by arrows 61, 62 upward through outer annular passage 63 and then downward through inner annular passage 64 as indicated by arrows 65, 66 whereupon the fan 60 expels warm air as shown. A heat liberating fin structure, not shown, may be situated between the walls 58, 59 to enhance the extraction of heat from the vapors in the duct means and the air drawn through the heat exchanges as already described.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. An attitude insensitive heat exchanger apparatus for heat liberating components in thermal communication with a dielectric liquid, comprising:
    means defining a main chamber for holding said dielectric liquid and non-condensible gas above said liquid;
    condenser means associated with said chamber to receive a dielectric liquid vapor generated by cooperation of said dielectric liquid and said heat liberating components
    means defining a storage tank; and
    means cooperating with said non-condensible gas and an interior region of said storage tank to thereby ensure that non-condensible gas displaced by said dielectric liquid vapor is in fluid communication with said interior region of said storage tank and to ensure that said interior of said storage tank is fluidly isolated from said dielectric liquid, thereby providing a heat exchanger apparatus that is insensitive to changes in the attitude of said heat exchanger and the dielectric liquid therein.

2. A heat exchanger apparatus for electrical components submerged in a dielectric liquid, comprising:
    means defining a closed main chamber for holding said dielectric liquid and a non-condensible gas above the liquid;
    means defining a closed blockage chamber for holding said non-condensible gas and segregating said gas and vapors of said liquid formed during operation of the heat exchanger, the blockage chamber being positioned within said main chamber in contact with the dielectric liquid, the side walls of said chambers being spaced from each other to form narrow condensation and segregating duct means within which the vapors of said liquid rise and condense; and orifice means in said closed blockage chamber near the top thereof, the orifice means being sized to allow entry into the blockage chamber of the non-condensible gas as the gas is swept up said duct means but to inhibit entry of the liquid should the apparatus be inverted or experience zero gravity forces.

3. The heat exchanger apparatus of claim 2, including air impingement means about the closed main chamber for directing cooling air thereagainst.

4. The heat exchanger apparatus of claim 3, including cooling fin means on the exterior of said main chamber.

5. The heat exchanger apparatus of claim 2, including cooling fin means on the exterior of said main chamber.

6. The heat exchanger apparatus of claim 2, wherein said blockage chamber has a top wall and said orifice means are located in the top wall.

7. The heat exchanger apparatus of claim 6, including channel means extending from the top wall of the blockage chamber, through the chamber to the bottom thereof, for the return to the bottom of the main chamber of liquid condensing on the top of the blockage chamber.

8. The heat exchanger apparatus of claim 7, wherein said channel means is funnel shaped and includes a small liquid passage opening at the bottom thereof.

9. The heat exchanger apparatus of claim 1, including channel means extending from a top wall of the blockage chamber, through the chamber to the bottom thereof, for the return to the bottom of the main chamber of liquid condensing on the top of the blockage chamber.

10. The heat exchanger apparatus of claim 9 wherein said channel means is funnel shaped and includes a mall liquid passage opening at the bottom thereof.

11. A heat exchanger apparatus for electrical components submerged in a dielectric liquid, comprising:

means defining a closed main chamber for holding said dielectric liquid and a non-condensible gas above the liquid;

means defining a closed blockage chamber for holding said non-condensible gas and segregating said gas and vapors of said liquid formed during operation of the heat exchanger, the blockage chamber being positioned within said main chamber in contact with the dielectric liquid, the side walls of said chambers being spaced from each other to form narrow condensation and segregating duct means within which the vapors of said liquid rise and condense;

orifice means in said closed blockage chamber near the top thereof, the orifice means being sized to allow entry into the blockage chamber of the non-condensible gas as the gas is swept up said duct means but to inhibit entry of the liquid should the apparatus be inverted or experience zero gravity forces;

channel means extending from the top wall of the blockage chamber, through the chamber to the bottom thereof, for the return to the bottom of the main chamber of liquid condensing on the top of the blockage chamber; and air impingement means about the closed main chamber for directing cooling air thereagainst.

12. The heat exchanger apparatus of claim 11, including cooling fin means on the exterior of said main chamber.

13. The heat exchanger apparatus of claim 11 wherein said orifice means are located in said top wall of the blockage chamber.

14. The heat exchanger apparatus of claim 11 wherein said channel means is funnel shaped and includes a small liquid passage opening at the bottom thereof.

* * * * *